(12) United States Patent
Amin et al.

(10) Patent No.: US 10,630,078 B2
(45) Date of Patent: Apr. 21, 2020

(54) ENERGY HARVESTER POWER INDICATOR AND POWER MANAGEMENT CIRCUITRY

(71) Applicant: Intel Corporation, Santa Clara, CA (US)

(72) Inventors: Sally Safwat Amin, Hillsboro, OR (US); Vaibhav Vaidya, Portland, OR (US); Harish K. Krishnamurthy, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 842 days.

(21) Appl. No.: 15/081,437

(22) Filed: Mar. 25, 2016

(65) Prior Publication Data

US 2017/0279276 A1 Sep. 28, 2017

(51) Int. Cl.
| H02J 1/00 | (2006.01) |
|---|---|
| H02J 3/38 | (2006.01) |
| H01L 31/06 | (2012.01) |
| H01L 35/02 | (2006.01) |
| H02J 7/35 | (2006.01) |

(52) U.S. Cl.
CPC .............. *H02J 3/383* (2013.01); *H01L 31/06* (2013.01); *H01L 35/02* (2013.01); *H02J 7/35* (2013.01)

(58) Field of Classification Search
CPC ........ H01L 2724/00; H01L 2724/00014; H02J 7/025; H02J 3/383
See application file for complete search history.

(56) References Cited

U.S. PATENT DOCUMENTS

| 7,781,943 B1 | 8/2010 | Hamel et al. | |
|---|---|---|---|
| 2009/0167221 A1* | 7/2009 | Rouis | H02P 6/15 318/400.14 |
| 2015/0171834 A1* | 6/2015 | Arp | H03K 5/1565 327/175 |
| 2015/0214841 A1 | 7/2015 | Ramorini et al. | |
| 2015/0311824 A1 | 10/2015 | Eltamaly et al. | |
| 2016/0197508 A1* | 7/2016 | Kruiskamp | H02J 7/0068 307/130 |
| 2017/0237282 A1* | 8/2017 | Huang | H02J 7/345 307/48 |

FOREIGN PATENT DOCUMENTS

| EP | 2999107 A1 | 3/2016 |
|---|---|---|
| WO | WO-2015109309 A1 | 7/2015 |
| WO | WO-2017165075 A1 | 9/2017 |

OTHER PUBLICATIONS

"International Application Serial No. PCT/US2017/019428, International Search Report dated May 23, 2017", 3 pgs.
"International Application Serial No. PCT/US2017/019428, Written Opinion dated May 23, 2017", 8 pgs.

* cited by examiner

*Primary Examiner* — Sibin Chen
(74) *Attorney, Agent, or Firm* — Schwegman Lundberg & Woessner, P.A.

(57) ABSTRACT

Some embodiments include apparatus and methods for using a switch to couple an inductor to an energy harvester for a time interval to allow charging of the inductor during the time interval, and using a circuit to generate control information for power management. A value of the control information is based on a value of the time interval.

19 Claims, 11 Drawing Sheets

ENERGY HARVESTER POWER INDICATOR AND POWER MANAGEMENT CIRCUITRY

TECHNICAL FIELD

Embodiments described herein pertain to energy harvesting. Some embodiments relate to power management in integrated circuits.

BACKGROUND

Some electronic devices (or systems) include an energy harvester to harvest energy from light (e.g., sunlight), thermal (e.g., heat) sources, vibration (e.g., piezoelectric vibrations), or other sources. Some of these devices have techniques to determine the amount of available energy from the energy harvester as part of power management in these devices. As described in more detail below, some conventional techniques may face efficiency challenges and reliability limitations.

DETAILED DESCRIPTION

Figure 1:
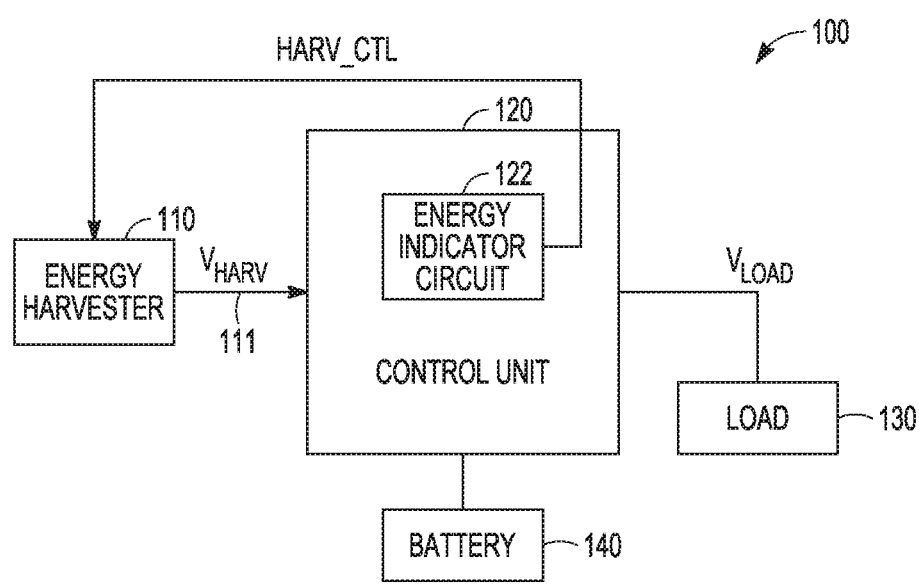
FIG. 1 shows an apparatus including an energy harvester and a control unit, according to some embodiments described herein.

Some conventional techniques of determining the amount of energy (e.g., power) available from an energy harvester in a system involve adding an auxiliary load to the energy harvester. Operations of the auxiliary load may degrade the efficiency of the system. Plus, additional resistance incurred by the auxiliary load may introduce instability to the system during start-up. Some conventional alternative techniques rely on a discharging operation of a circuit path to a load in order to determine the amount of energy available from the energy harvester. In the alternative techniques, the load voltage is assumed to be constant during the discharging operation. Thus, changes in load conditions may lead to inaccurate measurement, causing the alternative techniques to be unreliable.

The techniques described herein include circuitry that can operate to efficiently and accurately determine the amount of energy available from the energy harvester. The techniques described herein involve circuitry, which can include a control unit having an energy indicator circuit. The energy indicator circuit can be relatively small. This may reduce the total area and power overhead associated with operations involving the energy harvester. This may also improve overall efficiency of the energy harvesting system.

The information generated by the energy indicator circuit described herein may play a key role in enabling net zero energy systems. For example, energy harvesting may be disabled to avoid net loss in energy if the energy available from the energy harvester is much lower than the quiescent power. In another example, energy harvesting may be disabled if a heavy load condition occurs when the energy available from the energy harvester is low. This may avoid the situation where the load may unnecessarily wait for a long duration before it is served, thereby preventing voltage droop on a load power rail. The techniques described herein may also be used for telemetry, active power management, and enhancing a user experience.

The techniques described herein involve an improved maximum power point tracking (MPPT) scheme. In the described MPPT scheme, simplified algorithms (e.g., fractional open circuit MPPT) may be used if the information generated by the energy indicator circuit indicates that the amount of available energy from the energy harvester is low. Then, more thorough MPPT algorithms (e.g., hill climbing) may be used in order to improve accuracy of the MPPT and increase energy drawn from harvesting sources.

In the techniques described herein, the voltage is regulated at the voltage for maximum power to achieve MPPT for different harvesting sources. This regulation mechanism involves using a hysteresis comparator between the voltage at the energy harvester and a reference voltage, which is generated by the MPPT algorithm. This MPPT voltage regulation scheme results in a relationship between an inductor charging time (e.g., $T_{ON}$) and the amount of available energy from the energy harvester.

Different harvesting sources (e.g., PV cell and thermoelectric generator (TEG)) have different relationships (e.g., trends) between inductor charging time and the amount of energy available from the energy harvester. The techniques described herein are applicable to different energy harvesters in determining the amount of available energy from the energy harvesters. In the described techniques, determining the amount of energy available from the energy harvester can be based on inductor charging time of an inductor used in the energy harvesting system. In the described techniques, a load is decoupled from the energy harvester during the inductor charging time. Thus changes in load conditions may have minimal or no impact on the amount of energy available from the energy harvester during the inductor charging time. Therefore, determining the amount of energy available from the energy harvester based on the inductor charging time may be reliable and accurate. Other improvements and benefits of the techniques described herein are mentioned below.

FIG. 1 shows an apparatus 100 including an energy harvester 110 and a control unit 120, according to some embodiments described herein. Apparatus 100 can also include a load 130 and a battery 140. Apparatus 100 can include or be included in electronic devices and systems, such as computers, tablets, wearable things (e.g., smart watches), and other electronic devices or systems.

Energy harvester 110 can include a PV cell, a TEG, or other types of energy harvesters. Battery 140 can be a rechargeable battery. Examples of battery 140 include lithium-ion, nickel-cadmium, and lead-acid batteries.

Control unit 120 can charge (or recharge) battery 140 using energy harvested by energy harvester 110. Load 130 may use power from either energy harvester 110 or battery 140. Load 130 may use power from battery 140 if energy harvester 110 is disabled. In some arrangements of apparatus 100, battery 140 can be omitted. In such arrangements, load 130 can receive power directly from energy harvester 110.

As shown in FIG. 1, energy harvester 110 can generate a voltage $V_{HARV}$ and provide it at a node 111. Control unit 120 can operate to receive voltage $V_{HARV}$ and provide a voltage $V_{LOAD}$ to load 130. The value of voltage $V_{LOAD}$ can be less than the value of voltage $V_{HARV}$. In some arrangements, the value of voltage $V_{LOAD}$ can be at least equal to (e.g., greater than) the value of voltage $V_{HARV}$.

As shown in FIG. 1, control unit 120 can include an energy indicator circuit 122, which can generate control information HARV_CTL. The value of control information HARV_CTL can be used to determine (e.g., indicate) the amount of available energy from energy harvester 110. Control information HARV_CTL can be used as part of power management in apparatus 100. For example, control unit 120 can operate to cause energy harvester 110 to change from one operating mode to another operating mode based on the value of control information HARV_CTL. Energy harvester 110 can have different operating modes, which may include an energy harvesting mode (e.g., enabled mode) to harvest energy and a disabled mode to stop harvesting energy.

Control information HARV_CTL can have different values (e.g., digital value). One value of control information HARV_CTL can be used to indicate that the amount of available energy from energy harvester 110 is at a certain value (or within a certain range). Another value of control information HARV_CTL can be used to indicate that the amount of available energy from energy harvester 110 is at another value (or within another range).

Control information HARV_CTL can be represented by a signal. The level (e.g., voltage level) of the signal can be used to determine the value of control information HARV_CTL. For example, control information HARV_CTL can have one value (e.g., logic 0) if the signal has one level (e.g., a voltage level corresponding to logic 0) and another value (e.g., logic 1) if the signal has another level (e.g., a voltage level corresponding to logic 1).

Based on the value of control information HARV_CTL, control unit 220 can cause energy harvester 110 to either remain at its current operating mode or to change from the current operating mode to another operating mode. For example, control unit 220 can cause energy harvester 110 to remain in an energy harvesting mode to continue to harvest energy if control information HARV_CTL has one value. Control unit 220 can cause energy harvester 110 to change from the energy harvesting mode to a disabled mode to stop harvesting energy.

Control unit 120 and energy indicator circuit 122 can include components and operations similar to (or the same as) any control unit and any energy indicator circuit, respectively, described below with reference to FIG. 2A through FIG. 9.

Figure 2A:
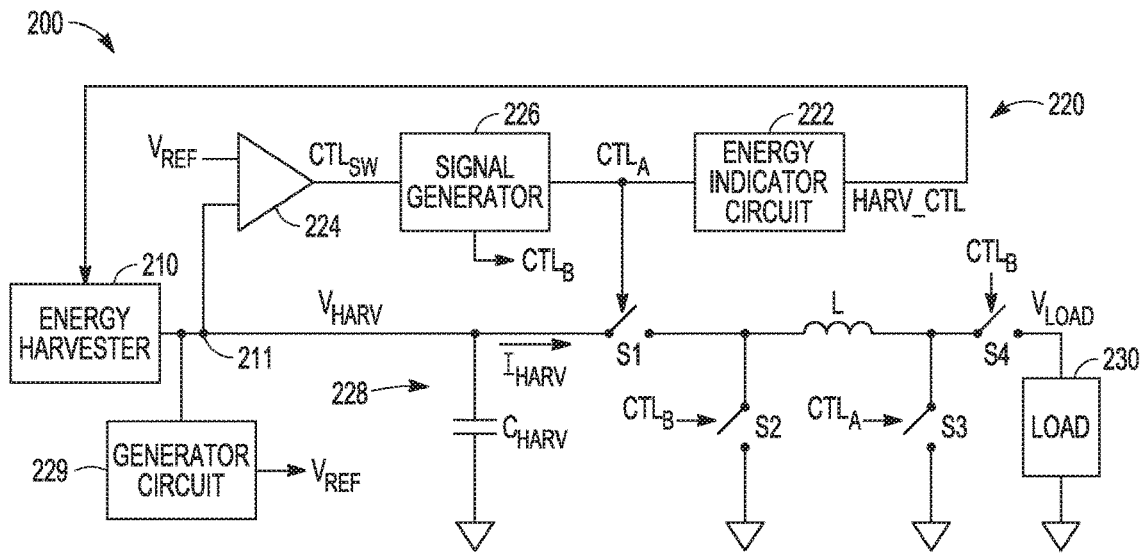
FIG. 2A shows an apparatus including a control unit having an energy indicator circuit, according to some embodiments described herein.

FIG. 2A shows an apparatus 200 including a control unit 220 having an energy indicator circuit 222, according to some embodiments described herein. Apparatus 200 can also include an energy harvester 210 and a load 230. Apparatus 200 can correspond to apparatus 100 of FIG. 1. Thus, energy harvester 210, control unit 220, and load 230 can correspond to energy harvester 110, control unit 120, and load 130, respectively, of FIG. 1.

As shown in FIG. 2A, control unit 220 can include a comparator 224 to generate a signal $CTL_{SW}$ based on voltages $V_{HARV}$ and $V_{REF}$, and a signal generator 226 to generate signals $CTL_A$ and $CTL_B$. Control circuit 220 can include a generator circuit 229 to generate voltage $V_{REF}$. Generator circuit 229 can include generator circuit 629 described below with reference to FIG. 6A. As shown FIG. 2A. Control unit 220 can also include a converter circuit 228, which can include a capacitor $C_{HARV}$, switches S1, S2, S3, and S4, and an inductor L. Each of switches S1, S2, S3, and S4 can include a transistor. The transistor can be a p-channel field effect transistor (FET), such as a p-channel metal-oxide semiconductor (MOS) FET (PMOS transistor), or an n-channel FET, such as an n-channel MOSFET (NMOS transistor).

FIG. 2A shows inductor L being part of control unit 220 as an example. In this example, inductor L can be located on the same die (e.g., on-die inductor) with control unit 220. Alternatively, inductor L can be located on the same integrated circuit (IC) package (e.g., on-package inductor) with control unit 220. In another arrangement, control unit 220 can be located in a die and inductor L can be located on a circuit board (e.g., on-board inductor) of a device or system that includes control unit 220 including inductor L.

In FIG. 2A, converter circuit 228 can operate to provide power (e.g., voltage $V_{LOAD}$) to load 230 based on the charging and discharging of inductor L. Energy indicator circuit 222 can generate control information HARV_CTL based on the amount of time associated with the charging and discharging of inductor L of converter circuit 228. Control information HARV_CTL can be used as part of power management in apparatus 200.

Figure 2B:
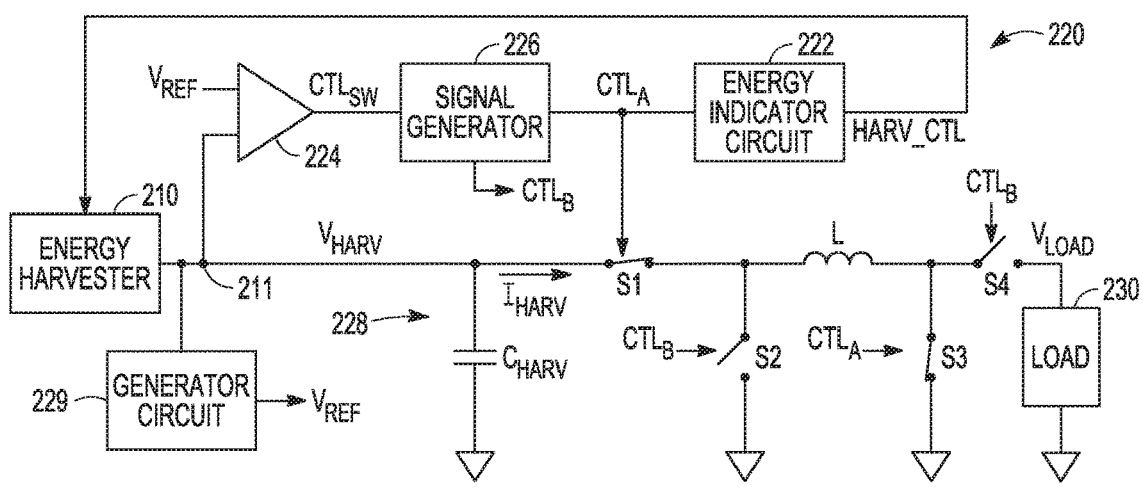
FIG. 2B shows the apparatus of FIG. 2A during charging of an inductor of the energy harvester, according to some embodiments described herein.
Figure 2C:
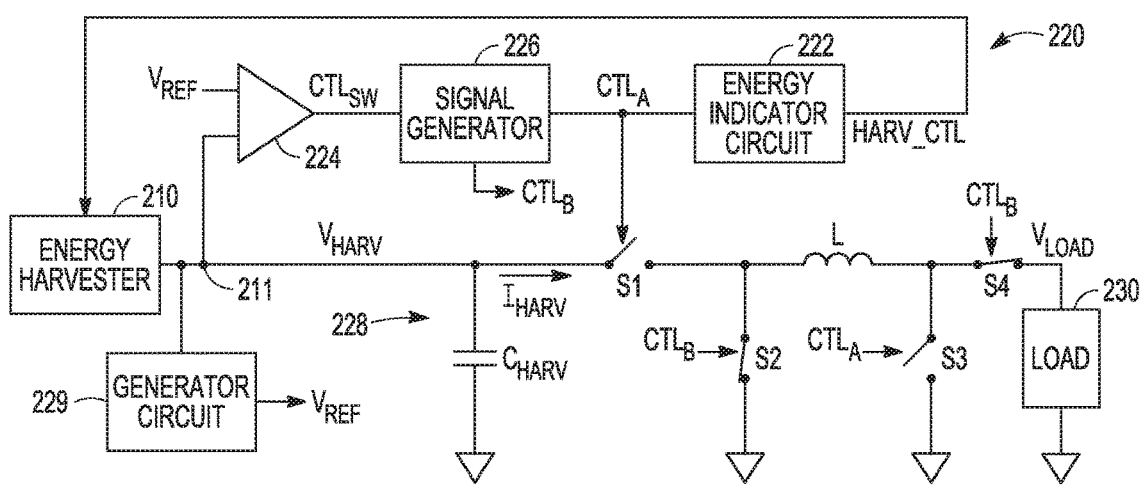
FIG. 2C shows the apparatus of FIG. 2A during discharging of the inductor of the energy harvester, according to some embodiments described herein.
Figure 2D:
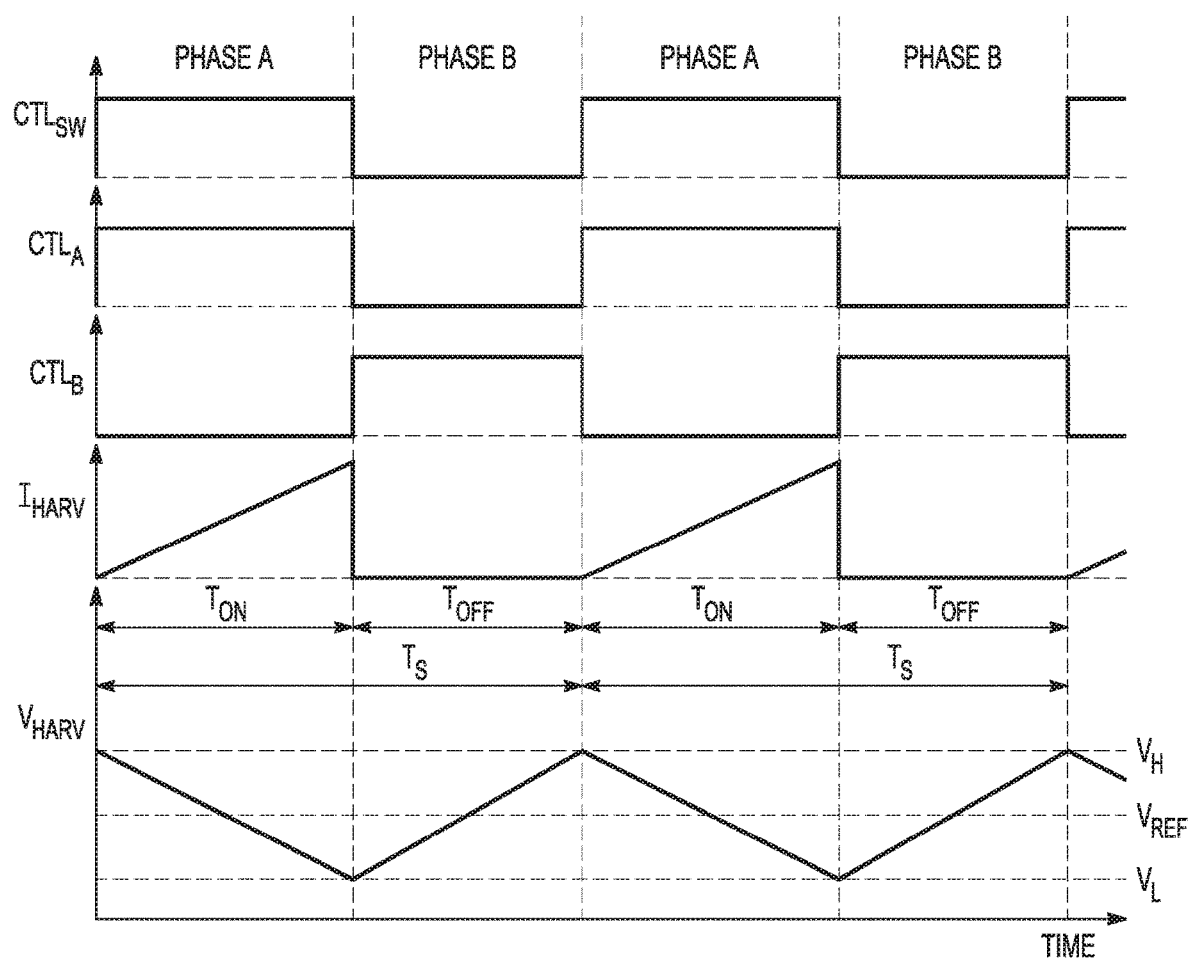
FIG. 2D shows a timing diagram of some of the signals for the control unit of FIG. 2A during operations of the apparatus of FIG. 2B and FIG. 2C, according to some embodiments described herein.

FIG. 2B shows apparatus 200 during charging of inductor L (and discharging of energy harvester 210), according to some embodiments described herein. FIG. 2C shows apparatus 200 during discharging of inductor L (and charging of energy harvester 210), according to some embodiments described herein. FIG. 2D shows a timing diagram of some of the signals for control unit 220 of FIG. 2A during operations of apparatus 200 of FIG. 2B and FIG. 2C, according to some embodiments described herein.

Charging of inductor L (FIG. 2B) can occur during phase A of FIG. 2D. Discharging of inductor L (FIG. 2C) can occur during phase B of FIG. 2D. Phase A has a time interval $T_{ON}$. Phase B has a time interval $T_{OFF}$. Time interval $T_S$ is the total amount of time of charging and discharging inductor L ($T_S = T_{ON} + T_{OFF}$). Each of time intervals $T_{ON}$ and $T_{OFF}$ has a value in time units (e.g., a fraction of a second). For example, each of time intervals $T_{ON}$ and $T_{OFF}$ can be in a range from 1 ns to 100 ns (nanoseconds).

In FIG. 2A, voltage $V_{HARV}$ at a node 211 is generated by energy harvester 210. Voltage $V_{REF}$ provided to one of the inputs of comparator 224 can be a reference voltage. Comparator 224 can compare the values of voltages $V_{HARV}$ and $V_{REF}$ and generate a signal $CTL_{SW}$. The duty cycle of signal $CTL_{SW}$ can be based on the values of voltages $V_{HARV}$ and $V_{REF}$. Control unit 220 can use signal $CTL_{SW}$ to generate signals $CTL_A$ and $CTL_B$ based on the duty cycle of signal $CTL_{SW}$. Control unit 220 uses signals $CTL_A$ and $CTL_B$ to control the switching of switches S1, S2, S3, and S4. This means that control unit 220 can control the switching of switches S1, S2, S3, and S4 based on the duty cycle of signal $CTL_{SW}$. As an example, the duty cycle of signal $CTL_{SW}$ can correspond to time interval $T_{ON}$ in FIG. 2D.

In apparatus 200, an MPPT technique may be used, such that converter circuit 228 can operate as a single-stage converter by regulating voltage $V_{HARV}$ around voltage $V_{REF}$ for maximum power point. The value of $V_{REF}$ can be less than the value of $V_{HARV}$.

Charging and discharging operations of apparatus 200 of FIG. 2A are described here with reference to FIG. 2A through FIG. 2D. During phase A, switches S1 and S3 can be turned on. Switches S2 and S4 can be turned off. Energy harvester 210 is coupled to inductor L (e.g., downstream of converter circuit 228) and charges inductor L. This causes the value of current $I_{HARV}$ to increase and causes the value of voltage $V_{HARV}$ to decrease from an initial value $V_H$ to a value $V_L$. Value $V_H$ can be greater than the value of voltage $V_{REF}$. Value $V_L$ can be less than the value of voltage $V_{REF}$. During phase B, energy harvester 210 is decoupled from inductor L, and energy harvester 210 charges capacitor $C_{HARV}$. This causes the value of voltage $V_{HARV}$ to increase and go back to its initial value $V_H$ and then enter a steady state. Thus, converter circuit 228 can operate to cause charging of inductor L for a time interval $T_{ON}$ (in phase A) and to cause discharging of inductor L for a time interval $T_{OFF}$ (in phase B). As described in more detail below, time interval $T_{ON}$ can be used to determine the amount of energy available from energy harvester 210.

Figure 3A:
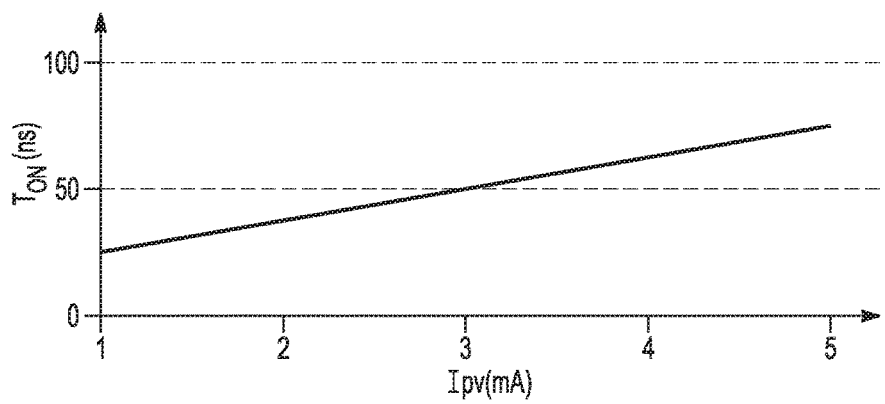
FIG. 3A and FIG. 3B show graphs illustrating relationships (e.g., trends) between inductor charging time and current, and between the total time of inductor charging and discharging time intervals and current, respectively, for an example where the energy harvester of FIG. 2A includes a photovoltaic (PV) cell, according to some embodiments described herein.
Figure 3B:
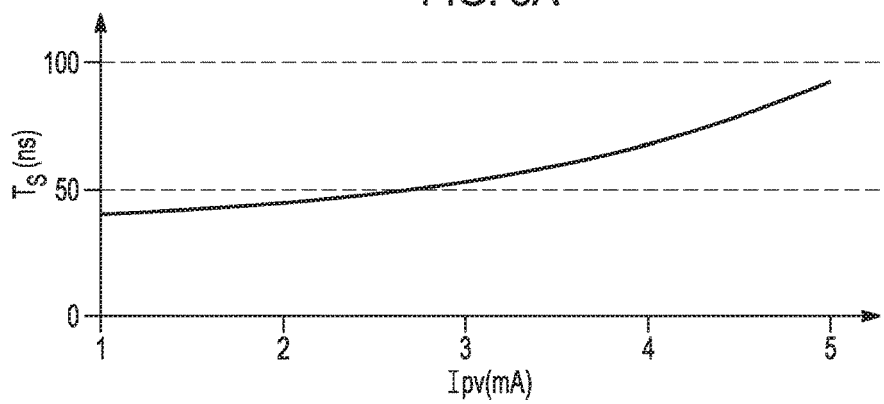

FIG. 3A and FIG. 3B show graphs illustrating relationships (e.g., trends) between time interval $T_{ON}$ (e.g., inductor charging time) and a current $I_{PV}$, and between time interval $T_S$ and current $I_{PV}$, respectively, for an example where energy harvester 210 of FIG. 2A includes a PV cell, according to some embodiments described herein. In FIG. 3A and FIG. 3B, assuming that energy harvester 210 is already regulated at a relatively constant voltage $V_{REF}$, a higher value of current $I_{PV}$ (which can correspond to current $I_{HARV}$ in FIG. 2A) corresponds to a higher amount of energy available from energy harvester 210. The higher the value of current $I_{PV}$, the higher the value for time intervals $T_{ON}$ and $T_S$. Thus, the value of each of time intervals $T_{ON}$ and $T_S$ is proportional to the amount of energy available from energy harvester 210. This means that if the value of time interval $T_{ON}$ is large, the amount of energy available from energy harvester 210 is large. Based on this relationship, energy indicator circuit 222 of FIG. 2A can generate control information HARV_CTL, which can be used as part of power management in apparatus 200, such as to control energy harvesting in apparatus 200 to improve efficiency and performance of load regulation in apparatus 200.

Figure 3C:
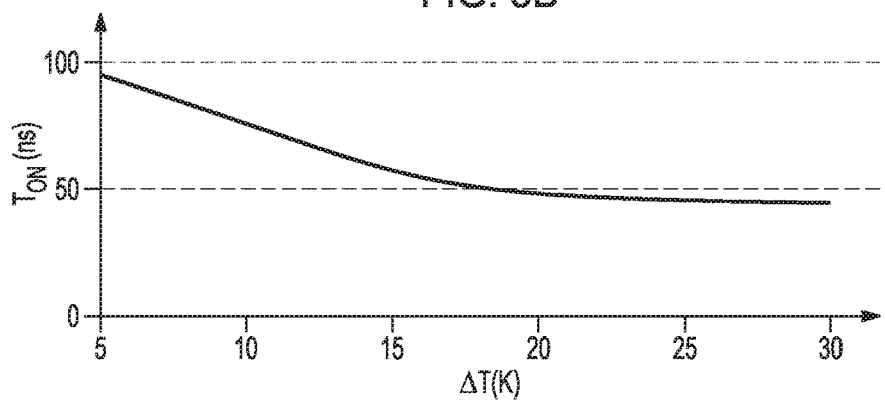
FIG. 3C and FIG. 3D show graphs illustrating relationships (e.g., trends) between inductor charging time and temperature difference, and between the total time of inductor charging and discharging time intervals and temperature difference, respectively, for an example where an energy harvester of FIG. 2A includes a thermoelectric generator (TEG), according to some embodiments described herein.
Figure 3D:
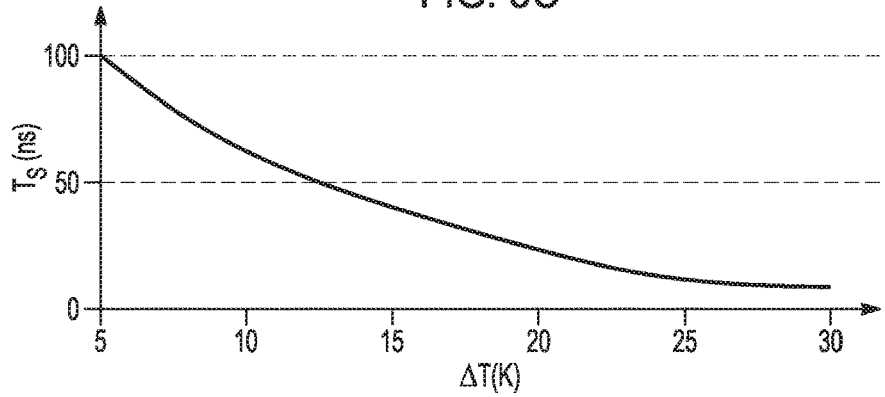

FIG. 3C and FIG. 3D show graphs illustrating relationships (e.g., trends) between time interval $T_{ON}$ (e.g., inductor charging time) and temperature difference, and between $T_S$ and temperature difference, respectively, for an example where energy harvester 210 of FIG. 2A includes a TEG, according to some embodiments described herein. In FIG. 3C and FIG. 3D, a higher value of the temperature difference (in Kevin) corresponds to a higher amount of energy available from energy harvester 210. The higher the value of the temperature difference, the lower the value for time intervals $T_{ON}$ and $T_S$. Thus, the value of each of time intervals $T_{ON}$ and $T_S$ is inversely proportional to the amount of energy available from energy harvester 210. This means that if the value of time interval $T_{ON}$ is large, the amount of energy available from energy harvester 210 is small. Based on this relationship, energy indicator circuit 222 of FIG. 2A can generate control information HARV_CTL, which can be used as part of power management in apparatus 200, such as to control energy harvesting in apparatus 200 to improve efficiency and performance of load regulation in apparatus 200.

Figure 4:
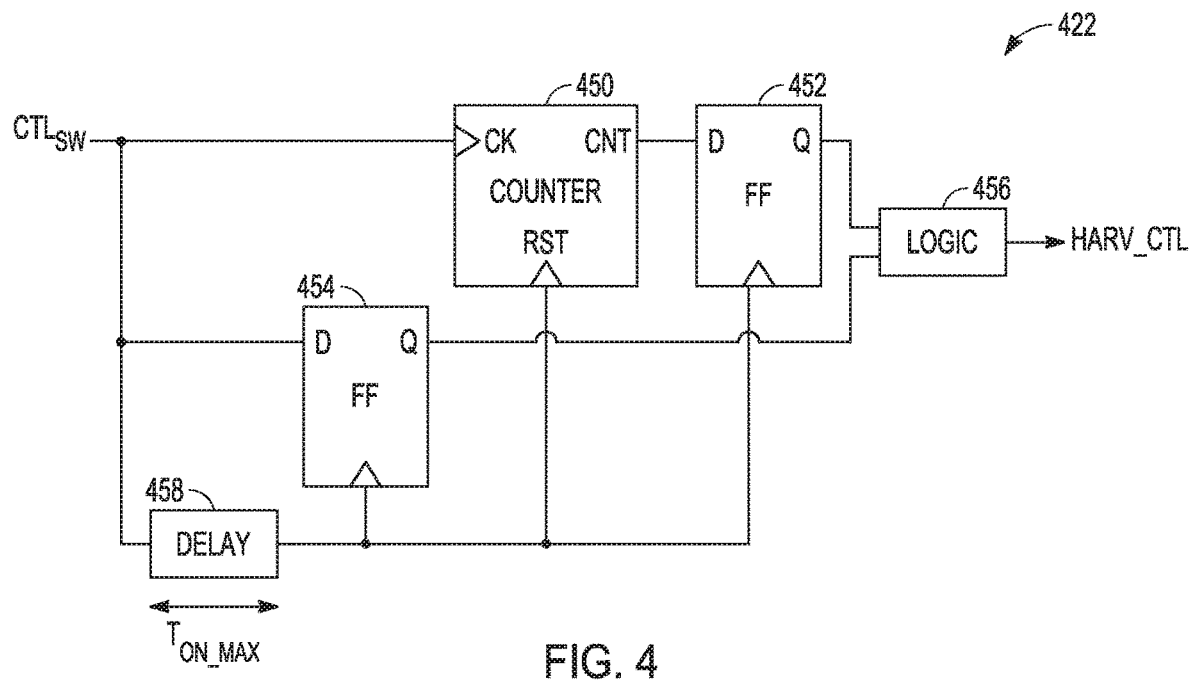
FIG. 4 shows an energy indicator circuit that can be included in the apparatus of FIG. 2A for an example where the energy harvester of FIG. 2A includes a TEG, according to some embodiments described herein.

FIG. 4 shows an energy indicator circuit 422, according to some embodiments described herein. Energy indicator circuit 422 can correspond to (e.g., can be used as) energy indicator circuit 222 of FIG. 2A where energy harvester 210 includes a TEG. As shown in FIG. 4, energy indicator circuit 422 can include a counter 450 having an input CK (e.g., clock input) to receive signal $CTL_{SW}$ (which can correspond to signal $CTL_{SW}$ of FIG. 2A), an input RST (e.g., reset input), and an output CNT (e.g., to provide a count value). Energy indicator circuit 422 can also include DQ flip-flops (FF) 452 and 454, a logic component 456, and a delay component 458.

Energy indicator circuit 422 can generate control information HARV_CTL, which can correspond to control information HARV_CTL of FIG. 2A. Thus, control information HARV_CTL generated by energy indicator circuit 422 can be used to cause energy harvester 210 to change between operating modes (e.g., between an energy harvesting mode and a disabled mode).

In FIG. 4, delay component 458 can include delay cells to provide a time delay $T_{ON\_MAX}$. Delay component 458 can be a variable delay. This means that time delay $T_{ON\_MAX}$ can be set (e.g., programmed) at a selected (e.g., predetermined) value, such as value $T_{SET}$. Value $T_{SET}$ can be based on a charging time of a battery (e.g., battery 140) at which energy from the energy harvester (e.g., energy harvester 210) is deemed to be minimum and less than its controller quiescent power.

As an example, time delay $T_{ON\_MAX}$ can be set at value $T_{SET}$ at a value in the lower range of time interval $T_{ON}$ in FIG. 3C. For this example, it is assumed that time delay $T_{ON\_MAX}$ is set at value $T_{SET}$ of 50 ns ($T_{ON\_MAX} = T_{SET} = 50$ ns) and energy indicator circuit 422 (FIG. 4) is used as energy indicator circuit 222 in control unit 220 of FIG. 2A.

Thus, in FIG. 4, signal $CTL_{SW}$ can have the waveform and associated time interval $T_{ON}$ shown in FIG. 2D.

Energy indicator circuit 422 of FIG. 4 can operate such that control information HARV_CTL can have a value of logic 0 if $T_{ON}$ (FIG. 2D) is less than $T_{ON\_MAX}$ (which is set at $T_{SET}$=50 ns in this example). In FIG. 3C, the amount of energy available from energy harvester 210 can be relatively higher when $T_{ON}$ is less than 50 ns than when $T_{ON}$ is greater than 50 ns. Thus, in this example, control unit 220 (FIG. 2A) can allow energy harvester 210 to continue harvesting energy (e.g., allow energy harvester 210 to remain in an energy harvesting mode).

In FIG. 4, energy indicator circuit 422 can operate such that control information HARV_CTL can have a value of logic 1 if $T_{ON}$ (FIG. 2D) is equal to or greater than $T_{ON\_MAX}$ (which is set at $T_{SET}$=50 ns in this example). As shown in FIG. 3C, the amount of energy available from energy harvester 210 can be relatively lower when $T_{ON}$ is greater than 50 ns than when $T_{ON}$ is less than 50 ns. Thus, in this example, control unit 220 (FIG. 2A) can cause energy harvester 210 to stop harvesting energy (e.g., to change from an energy harvesting mode to a disabled mode).

Thus, in the above example, energy indicator circuit 422 can provide knowledge of when energy harvesting can be continued (and when energy harvesting can be stopped) based on the value of information HARV_CTL. For example, energy harvester 210 can be in one operating mode (e.g., energy harvesting mode) if control information HARV_CTL (FIG. 4) has one value (e.g., logic 0) and in another operating mode (e.g., disabled mode) if control information HARV_CTL has another value (e.g., logic 1).

Figure 5:
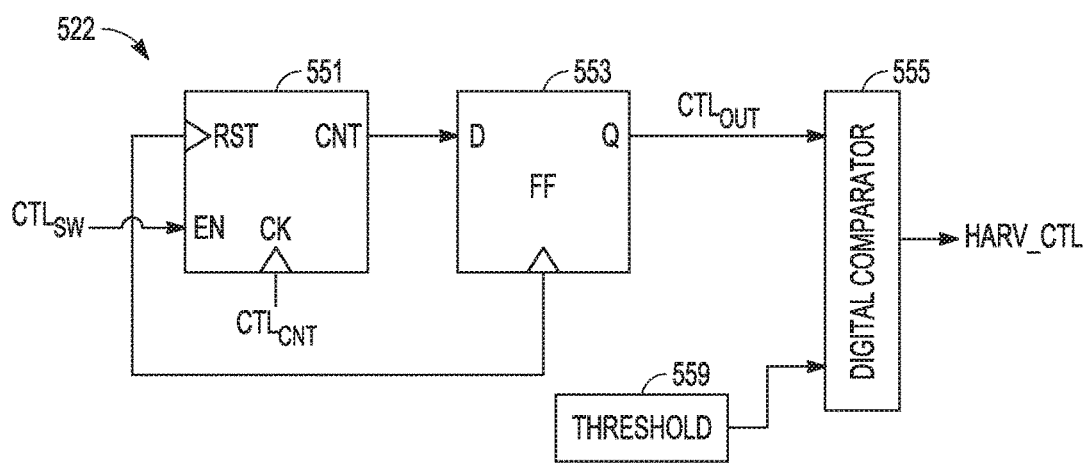
FIG. 5 shows an energy indicator circuit that can be included in the apparatus of FIG. 2A for an example where the energy harvester of FIG. 2A includes a PV cell, according to some embodiments described herein.

FIG. 5 shows an energy indicator circuit 522, according to some embodiments described herein. Energy indicator circuit 522 can correspond to (e.g., can be used as) energy indicator circuit 222 of FIG. 2A where energy harvester 210 includes a PV cell. As shown in FIG. 5, energy indicator circuit 522 can include a counter 551 having an input EN (e.g., enabled input) to receive a signal $CTL_{SW}$ (which can correspond to signal $CTL_{SW}$ of FIG. 2A), an input CK (e.g., clock input) to receive a clock signal $CLK_{CNT}$, an input RST (e.g., reset input), and an output CNT (e.g., to provide a count value); and a DQ flip-flop 553 to provide a count $CNT_{OUT}$. Energy indicator circuit 522 can also include a comparator 555 (which can be a digital comparator) to compare count $CNT_{OUT}$ with threshold information THRESHOLD stored in a memory component (e.g., register) 559.

Energy indicator circuit 522 can generate control information HARV_CTL, which can correspond to control information HARV_CTL of FIG. 2A. Thus, control information HARV_CTL generated by energy indicator circuit 522 can be used to cause energy harvester 210 to change between operating modes (e.g., between an energy harvesting mode and a disabled mode).

As shown in FIG. 5, comparator 555 can generate control information HARV_CTL based on a comparison between the values of count $CNT_{OUT}$ and information THRESHOLD. Information THRESHOLD can provide a value (e.g., digital value). The value of information THRESHOLD can be a variable value. This means that the value of information THRESHOLD can be set (e.g., programmed) at a selected (e.g., predetermined) value, such as value $TH_{SET}$. Value $TH_{SET}$ can be a value at which energy from the energy harvester (e.g., energy harvester 210) is deemed to be minimum and less than its controller quiescent power.

As an example, the value of information THRESHOLD can be set to be a nearest integer of X/T (X divided by T), such as $TH_{SET}$=floor (X/T) or $TH_{SET}$=ceiling (X/T), where X is a selected value in the higher range of time interval $T_{ON}$ in FIG. 3C, and T is the period of clock signal $CLK_{CNT}$ (FIG. 5). For this example, if it is assumed that X=40 ns and T=2 ns, then $TH_{SET}$=40/2=20. It is also assumed that energy indicator circuit 522 (FIG. 5) is used as energy indicator circuit 222 in control unit 220 of FIG. 2A. Thus, in FIG. 5, signal $CTL_{SW}$ can have the waveform and associated time interval $T_{ON}$ shown in FIG. 2D.

In PV cell, time interval $T_{ON}$ can have a linear relationship with light intensity, which has a linear relationship with the amount of energy available from the PV energy harvester. Thus, time interval $T_{OFF}$ during discharging of inductor L (in phase B of FIG. 2D), which is during charging of energy harvester 210, can also have a linear relationship light intensity. In FIG. 5, counter 551 and DQ flip-flop 553 can operate to count the number of periods of clock signal $CLK_{CNT}$ during the discharging of inductor L (during charging of energy harvester 210). Thus, the value of count $CNT_{OUT}$ is proportional to the amount of energy available from the PV energy harvester (e.g., energy harvester 210).

In FIG. 5, energy indicator circuit 522 can operate such that control information HARV_CTL can have a value of logic 1 if count $CNT_{OUT}$ has a value less than the value of information THRESHOLD (which is $TH_{SET}$=20 in this example). This means that the value of time interval $T_{ON}$ (FIG. 2D) is less than the value of X of 40 ns in this example. As shown in FIG. 3A, the amount of energy available from energy harvester 210 can be relatively lower when $T_{ON}$ is less than 40 ns than when $T_{ON}$ is greater than 40 ns. Thus, in this example, control unit 220 (FIG. 2A) can cause energy harvester 210 to stop harvesting energy (e.g., cause energy harvester 210 to change from an energy harvesting mode to a disabled mode).

In FIG. 5, energy indicator circuit 522 can operate such that control information HARV_CTL can have a value of logic 0, if count $CNT_{OUT}$ has a value equal to or greater than the value of information THRESHOLD (which is $TH_{SET}$=20 in this example). This means that the value of time interval $T_{ON}$ (FIG. 2D) is greater than the value of X of 40 ns in this example. As shown in FIG. 3A, the amount of energy available from energy harvester 210 can be relatively higher when $T_{ON}$ is greater than 40 ns than when $T_{ON}$ is less than 40 ns. Thus, in this example, control unit 220 (FIG. 2A) can cause energy harvester 210 to start harvesting (or continue to harvest) energy (e.g., to change from a disabled mode to an energy harvesting mode).

Thus, in the above example, energy indicator circuit 522 can provide knowledge of when energy harvesting can be continued (and when energy harvesting can be stopped) based on the value of information HARV_CTL. For example, energy harvester 210 can be put in one operating mode (e.g., energy harvesting mode) if control information HARV_CTL (FIG. 5) has one value (e.g., logic 1) and in another operating mode (e.g., disabled mode) if control information HARV_CTL has another value (e.g., logic 0).

Figure 6A:
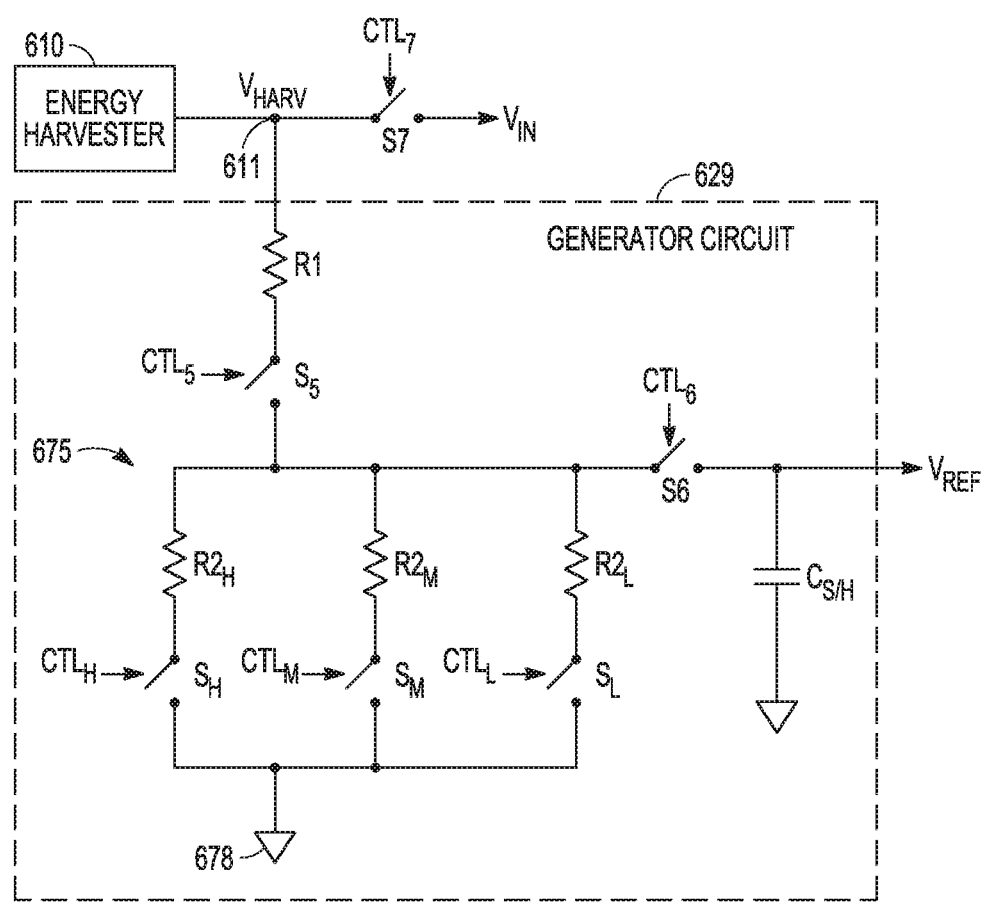
FIG. 6A shows an energy harvester and a generator circuit including a variable resistor network, according to some embodiments described herein.

FIG. 6A shows an energy harvester 610 and a generator circuit 629 including a variable resistor network 675, according to some embodiments described herein. Energy harvester 610 and a generator circuit 629 can correspond to energy harvester 210 and a generator circuit 229, respectively, of FIG. 2A. Energy harvester 610 can generate voltage $V_{HARV}$ at a node 611, which can be similar to node 211 of FIG. 2A. Generator circuit 629 can generate a voltage $V_{IN}$ that be provided as input voltage (e.g., load voltage) to other components (e.g., a load) coupled to energy harvester 610. Generator circuit 629 can generate a voltage $V_{REF}$ that can be used in apparatus 200 of FIG. 2A. Voltage $V_{REF}$ in FIG. 6A can correspond to voltage $V_{REF}$ in FIG. 2A provided to one of the inputs of comparator 224 of FIG. 2A.

As shown in FIG. 6A, generator circuit 629 can include a resistive divider that includes a resistor R1 (e.g., ultra-low power resistor) coupled to variable resistor network 675 at a node (e.g., an intermediate node) 677. Variable resistor network 675 includes resistors $R2_L$, $R2_M$, and $R2_H$ (e.g., ultra-low power resistors) coupled in parallel between node 677 and ground connection 678. Generator circuit 629 can also include capacitors $C_{HARV}$ and $C_{S/H}$ (sample and hold capacitor), and switches S5, S6, S7, $S_L$, $S_M$, and $S_H$ controlled by signals $CTL_5$, $CTL_6$, $CTL_7$, $CTL_L$, $CTL_M$, and $CTL_H$, respectively. The operation of generator circuit 629 is described below.

Figure 6B:
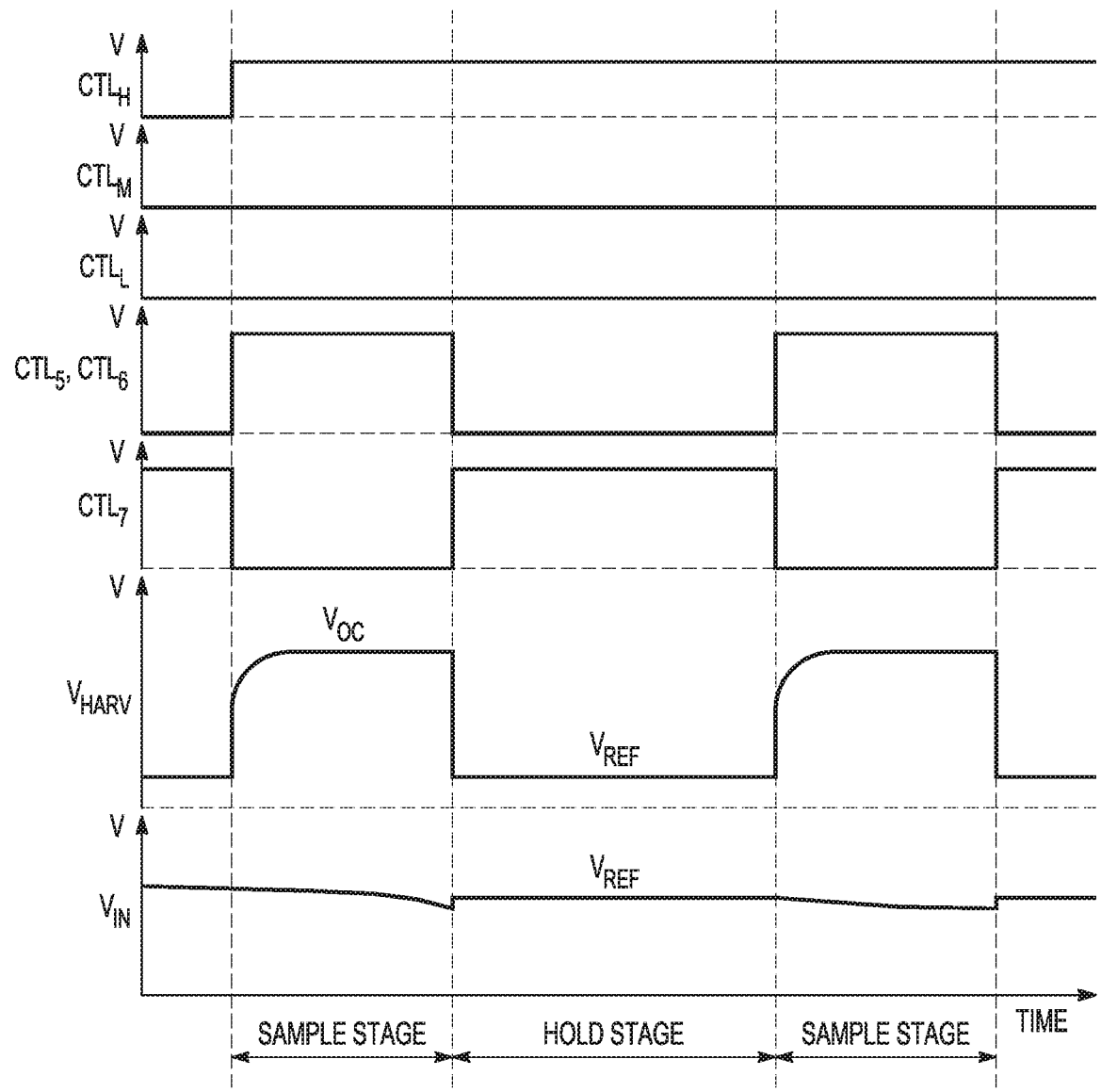
FIG. 6B shows a timing diagram of some of the signals for the generator circuit of FIG. 6A, according to some embodiments described herein.

FIG. 6B shows a timing diagram of some of the signals for generator circuit 629 of FIG. 6A, according to some embodiments described herein. Generator circuit 629 may use a fractional open circuit MPPT scheme to generate voltage $V_{REF}$ for maximum power transfer. The operations of generator circuit 629 can include a sample stage (e.g., for approximately 2 μs (microsecond)) and a hold stage (e.g., for approximately 1 μs (microsecond)).

In the sample stage, switches S5 and S6 and one of switches $S_L$, $S_M$, and $S_H$ can be turned on, and switch S7 can be turned off. In the sample stage, energy harvester 610 is decoupled from the downstream converter (e.g., converter circuit 228 of FIG. 2A), voltage $V_{HARV}$ is based on a voltage $V_{OC}$ (e.g., open circuit voltage), and a resistive divider stores voltage $V_{OC}$ on capacitor $C_{S/H}$. The value of voltage $V_{REF}$ is based on formula (1).

$$V_{REF}=[R2/(R1+R2)]V_{OC} \quad (1)$$

where R2 is one of $R2_L$, $R2_M$, and $R2_H$, depending on which of switches $S_L$, $S_M$, and $S_H$ is turned on. Controlling of switches $S_L$, $S_M$, and $S_H$ is described in more detail below with reference to FIG. 7A and FIG. 7B.

In FIG. 6A and FIG. 6B, in the hold stage, switch S7 can be turned on, switches S5 and S6 can be turned off, and switches $S_L$, $S_M$, and $S_H$ can be turned off. In the hold stage, voltage $V_{HARV}$ and voltage $V_{IN}$ can have values approximately equal to the value of voltage $V_{REF}$. The value of voltage $V_{REF}$ during the sample and hold stages can be approximately the same.

In formula (1), $R2/(R1+R2)=K$ is the resistive divider ratio that determines the voltage used for MPPT regulation. In an arrangement of variable resistor network 675, ratio K can be set to be 0.5 (e.g., K=0.5). In an alternative arrangement (e.g., when energy harvester 610 includes a PV energy harvester), ratio K can be greater than 0.5. For example, ratio K can have a range from 0.75 to 0.83 (or other ranges greater than 0.5 and less than 1) where energy harvester 610 includes a PV cell. Resistors $R2_L$, $R2_M$, and $R2_H$ can have different values (resistance values). Thus, different values of ratio K can be selected by selectively activating one of signals $CTL_L$, $CTL_M$, and $CTL_H$ to turn on one of switches $S_L$, $S_M$, and $S_H$. This forms a circuit path between node 667 and ground connection 678 through one of resistors $R2_L$, $R2_M$, and $R2_H$ and the turned-on switch (one of switches $S_L$, $S_M$, and $S_H$).

Some conventional techniques may use a fixed resistive divider with a fixed ratio. In some situations (e.g., when a PV energy harvester is used), such a fixed ratio may be inefficient, which may lead to waste of power due to operations performed to keep overhead power low because of the fixed ratio arrangement.

In FIG. 6A, by including variable resistor network 675 in generator circuit 629, and by controlling of switches $S_L$, $S_M$, and $S_H$ to select the value for ratio K (e.g., 0.5<K<1), thereby varying the value of variable resistor network 675, further improvement for energy harvesting can be obtained, as described below.

Figure 6C:
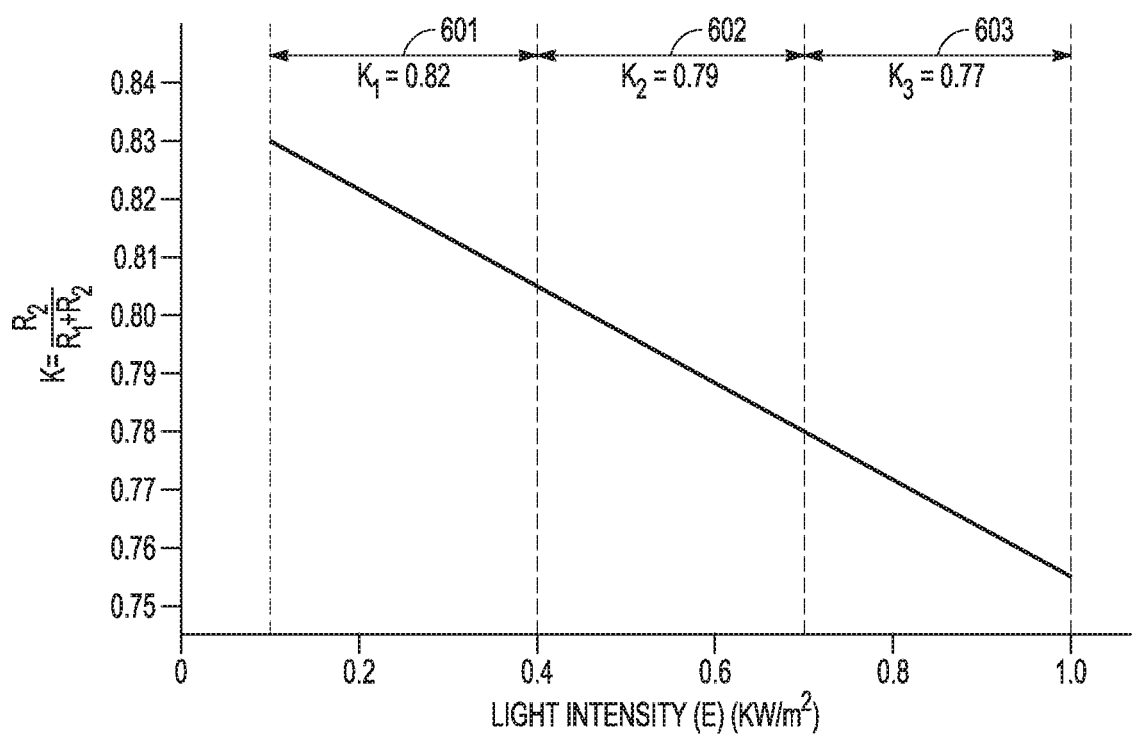
FIG. 6C shows a graph illustrating different values of a resistor ratio of a resistive divider of the generator circuit of FIG. 6A assigned to different light intensity regions, according to some embodiments described herein.

FIG. 6C shows a graph illustrating different values of resistor ratio K assigned to different regions (light intensity regions) 601, 602, and 603, according to some embodiments described herein. As described above with reference to FIG. 5, the value of control information HARV_CTL generated by energy indicator circuit 522 can provide knowledge of when energy can be harvested. Based on this knowledge, the light intensity in FIG. 6C can be divided into regions, such as regions 601, 602, and 603. Three regions 601, 602, and 603 are used as an example. The number of regions can vary. As shown in FIG. 6C, three values of ratio K (which is $K=R2/(R1+R2)$) can be calculated and assigned to regions 601, 602, and 603. For example, $K_1=0.82$, $K_2=0.79$, and $K_3=0.77$ can be assigned to regions 601, 602, and 603, respectively. The values (e.g., $K_1=0.82$, $K_2=0.79$, and $K_3=0.77$) for ratio K can be selected (e.g., calculated) by appropriately selecting the values for resistors $R2_L$, $R2_M$, and $R2_H$, respectively, based on formula (1) where the value of R2 is substituted by $R2_L$, $R2_M$, or $R2_H$. For example, the value of resistor $R2_H$ can be appropriately selected, so that $K=K_3=R2_H/(R1+R2_H)=0.77$. Similarly, $K=K_2=R2_M/(R1+R2_M)$; and $K=K_1=R2_L/(R1+R2_L)$.

Signals $CTL_L$, $CTL_M$, and $CTL_H$ in FIG. 6A can be selected based on the relationships between assigned values (e.g., $K_1=0.82$, $K_2=0.79$, and $K_3=0.77$) of ratio K and light intensity in FIG. 6C. For example, assuming that the values of resistors follow an order $R2_H<R2_M<R2_L$, and the light intensity from which energy harvester 610 harvests energy is in region 603 (associated with $K=K_3$), then signal $CTL_H$ can be activated and signals $CTL_L$ and $CTL_M$ can be deactivated, as shown in FIG. 6B. In this example, switch $S_H$ is turned on, and switches $S_M$ and $S_L$ are turned off. This causes the value of ratio K to be $K_3=R2_H/(R1+R2_H)=0.77$ and allows proper operation of generator circuit 629 based on the value of $K_3$ assigned to region 603. Determining in which of regions 601, 602, and 603 energy harvester 610 is harvesting energy at a particular time can be based on the operation of an energy indicator circuit described below with reference to FIG. 7A.

The inclusion of variable resistor network 675 and selection of the value for ratio K in generator circuit 629 (FIG. 6A) based on light intensity regions (e.g., regions 601, 602, and 603) may improve the accuracy of the fractional open circuit voltage MPPT algorithm. This may also improve the overall efficiency and energy drawn out of the energy harvester sources, improve performance, and avoid energy harvester charge cycles during certain load conditions (e.g., high load) to improve the overall droop performance for the output power (e.g., rail voltage).

Figure 7A:
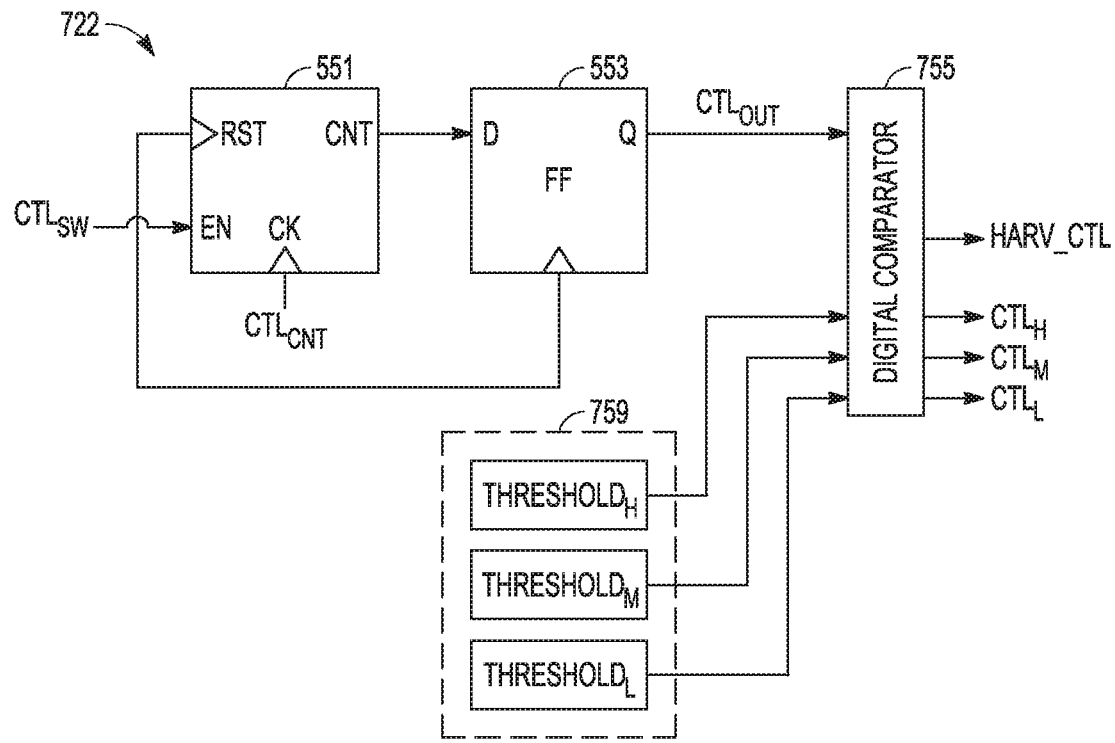
FIG. 7A shows an energy indicator circuit having a memory component to store multiple threshold information, according to some embodiments described herein.

FIG. 7A shows an energy indicator circuit 722 having a memory component (e.g., register) 759 to store multiple threshold information $THRESHOLD_L$, $THRESHOLD_M$, and $THRESHOLD_H$, according to some embodiments described herein. Energy indicator circuit 722 can correspond to energy indicator circuit 222 of FIG. 2A where energy harvester 210 includes a PV cell. Energy indicator circuit 722 can generate signals $CTL_L$, $CTL_M$, and $CTL_H$, and control signal HARV_CTL. Control signal HARV_CTL can be used to control (e.g., enable or disable) the operation of the energy harvester (e.g., energy harvester 210 of FIG. 2A or energy harvester 610 of FIG. 6A). Signals $CTL_L$, $CTL_M$, and $CTL_H$ in FIG. 7A can be used to control switches $S_L$, $S_M$, and $S_H$ of FIG. 6A. Energy indicator circuit 722 can generate signals $CTL_L$, $CTL_M$, and $CTL_H$ based on time interval $T_{ON}$ (FIG. 2D).

Figure 7B:
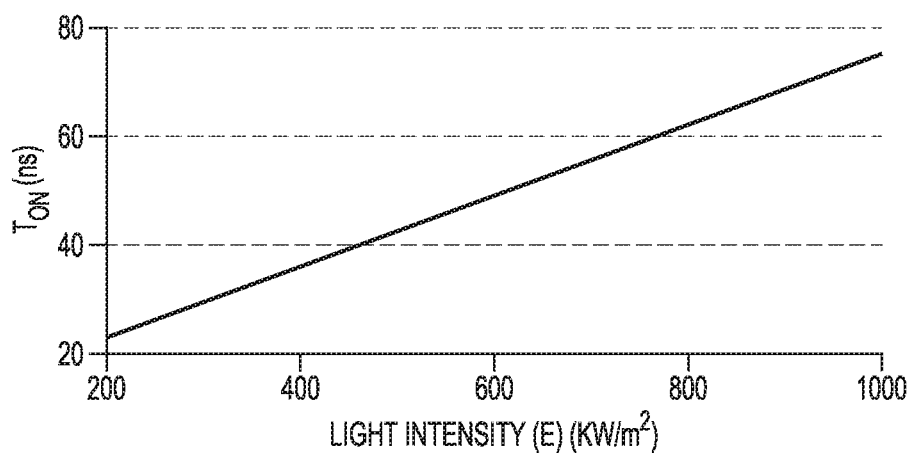
FIG. 7B shows a graph illustrating a relationship between inductor charging time in FIG. 2D and light intensity, according to some embodiments described herein.

FIG. 7B shows a graph illustrating a relationship between time interval $T_{ON}$ (e.g., inductor charging time in FIG. 2D) and light intensity, according to some embodiments described herein. As shown in FIG. 7B, the value of time interval $T_{ON}$ can have a linear relationship with light intensity. Based on this relationship, energy indicator circuit 722 (FIG. 7A) can operate in ways similar to those of energy indicator circuit 522 (FIG. 5) to generate control information HARV_CTL. However, energy indicator circuit 722 can also generate signals $CTL_L$, $CTL_M$, and $CTL_H$ to control switches $S_L$, $S_M$, and $S_H$ of FIG. 6A in order to select the value of ratio K to further improve the energy harvesting of energy harvester 210.

As shown in FIG. 7A, energy indicator circuit 722 can include counter 551, DQ flip-flop 553, and comparator 755 (which can be a digital comparator) that can operate in ways similar to counter 551, DQ flip-flop 553, and comparator 555 of FIG. 5 to generate control information HARV_CTL.

The value of each of information $THRESHOLD_L$, $THRESHOLD_M$, and $THRESHOLD_H$ can be set at values such as $TH_{SET1}$, $TH_{SET2}$, and $TH_{SET3}$, respectively, such that $TH_{SET1} < TH_{SET2} < TH_{SET3}$. Value $TH_{SET1}$ can correspond to value $TH_{SET}$ (e.g., $TH_{SET1} = TH_{SET} = 20$) of information THRESHOLD in FIG. 5. As described above, value $TH_{SET}$ (or $TH_{SET1}$ of information $THRESHOLD_L$) can be set to a value at which energy from the energy harvester (e.g., energy harvester 210) is deemed to be minimum and less than its controller quiescent power. In FIG. 7A, comparator 755 can generate signal HARV_CTL based on the value of count $CNT_{OUT}$ and information $THRESHOLD_L$ (e.g., $TH_{SET1} = 20$) in ways similar to comparator 555 described above with reference to FIG. 5.

In FIG. 7A, comparator 755 can activate signals $CTL_L$, $CTL_M$, and $CTL_H$ (one at a time) if control information HARV_CTL has a value (e.g., logic 1) that causes energy harvester 210 to be in an energy harvesting mode. Among signals $CTL_L$, $CTL_M$, and $CTL_H$, if one signal (e.g., $CTL_H$) is activated, the other signals (e.g., $CTL_M$ and $CTL_L$) are deactivated.

Comparator 755 can activate signals $CTL_L$, $CTL_M$, and $CTL_H$ based on ranges, which can be selected based on the value of time interval $T_{ON}$. For example, if the range time interval $T_{ON}$ is 1 ns to 100 ns, then the values within the range can be selected. The three values (e.g., digital values) can be stored as the values for information $THRESHOLD_L$, $THRESHOLD_M$, and $THRESHOLD_H$.

Each of the values of information $THRESHOLD_L$, $THRESHOLD_M$, and $THRESHOLD_H$ can be calculated in ways similar to that of information THRESHOLD of FIG. 5. As described above with reference to FIG. 5, the value of information THRESHOLD can be set at $TH_{SET} = $ floor (X/T) or $TH_{SET} = $ ceiling (X/T), where X is a selected value in the higher range of time interval $T_{ON}$ in FIG. 3C, and T is the period of clock signal $CLK_{CNT}$ (FIG. 5 and FIG. 7). Thus, as an example, assuming that three values 40 ns, 50 ns, and 60 ns are selected from the range of time interval $T_{ON}$ and assuming that the period of clock signal $CLK_{CNT}$ in FIG. 7A is T=2 ns (e.g., same as the example in FIG. 5), then the stored values of information $THRESHOLD_L$, $THRESHOLD_M$, $THRESHOLD_H$ can be $TH_{SET1} = 40/2 = 20$; $TH_{SET2} = 50/2 = 25$; and $TH_{SET3} = 60/2 = 30$, respectively.

In FIG. 7A, comparator 755 can compare the value of count $CNT_{OUT}$ with the value (stored value) of each of information $THRESHOLD_L$, $THRESHOLD_M$, and $THRESHOLD_H$. Based on these comparisons, comparator 755 can activate signals $CTL_L$, $CTL_M$, and $CTL_H$ accordingly. For example, comparator 755 can operate to activate signal $CTL_L$ if $20 \leq CNT_{OUT} \leq 25$, activate signal $CTL_M$ if $25 < CNT_{OUT} \leq 30$, and activate signal $CTL_H$ if $CNT_{OUT} > 30$. In this example, none of signals $CTL_L$, $CTL_M$, and $CTL_H$ may be activated if $CNT_{OUT} < 20$.

As described above, signals $CTL_L$, $CTL_M$, and $CTL_H$ generated by energy indicator circuit 722 can be used to control switches $S_L$, $S_M$, and $S_H$, respectively, of FIG. 6A. This allows selection of the values (e.g., $K_1 = 0.82$, $K_2 = 0.79$, and $K_3 = 0.77$) for ratio K based on light intensity regions (e.g., regions 601, 602, and 603). Improvements based on this selection are described above with reference to FIG. 6A through FIG. 6C.

Figure 8:
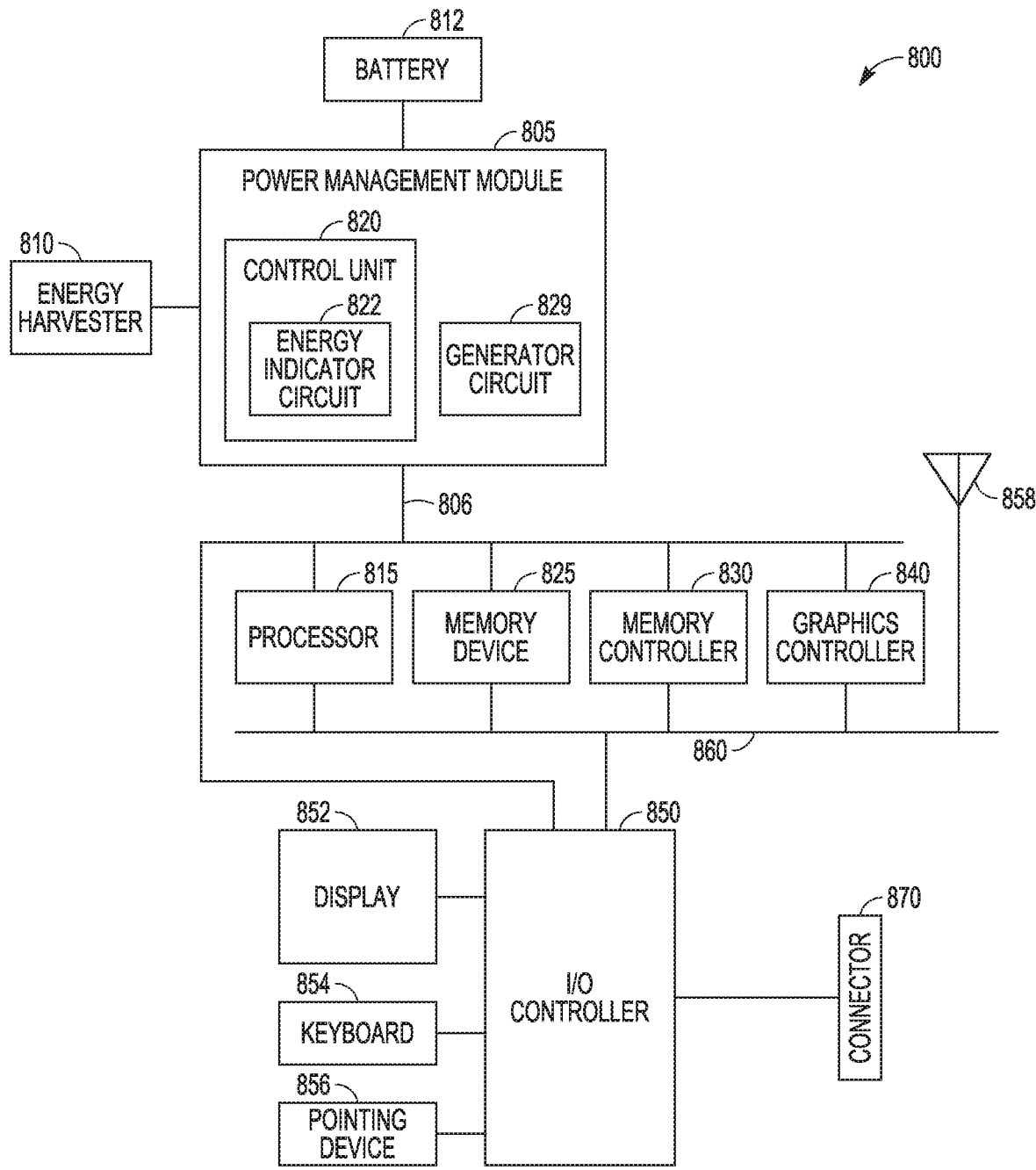
FIG. 8 shows an apparatus in the form of an electronic system, according to some embodiments described herein.

FIG. 8 shows an apparatus in the form of a system (e.g., electronic system) 800, according to some embodiments described herein. System 800 can include or be included in a computer, a tablet, wearable electronic things (e.g., smart watches), and other electronic systems. As shown in FIG. 8, system 800 can include components, such as a processor 815, a memory device 825, a memory controller 830, a graphics controller 840, an input and output (I/O) controller 850, a display 852, a keyboard 854, a pointing device 856, at least one antenna 858, a connector 870, and a bus 860. Bus 860 can include conductive lines (e.g., metal-based traces on a circuit board where the components of system 800 are located).

System 800 can also include a power management module 805 to manage and provide power to other components of system 800 through power delivery paths 806. System 800 can include an energy harvester 810 to harvest energy, and a battery 812 to store energy harvested by energy harvester 810. Battery 812 can include battery 140 of FIG. 1. Energy harvester 810 can include any of the energy harvesters described above with reference to FIG. 1 through FIG. 7B.

As shown in FIG. 8, power management module 805 can include a control unit 820, which can include an energy indicator circuit 822, and a generator circuit 829. Control unit 820, energy indicator circuit 822, and generator circuit 829 can be any of the control units, energy indicator circuits, and generator circuits, respectively, described above with reference to FIG. 1 through FIG. 7B.

System 800 can include an inductor (not shown in FIG. 8), which can be similar to, or the same as, inductor L of FIG. 2A. The inductor can be located on the same die (e.g., on-die inductor) with control unit 820 (e.g., same semiconductor die or same IC chip). In an alternative arrangement, the inductor can be located on the same IC package (e.g., on-package inductor) with control unit 820. In another arrangement, control unit 820 can be located in a die and the inductor can be located on the circuit board (e.g., on-board inductor) of system 800.

In FIG. 8, power management module 805 can provide power to other components from energy harvester 810 or from battery 812. In some arrangements, battery 812 can be omitted from system 800, such that power management module 805 can provide power to other components directly from energy harvester 810.

In FIG. 8, each of processor 815, memory device 825, memory controller 830, graphics controller 840, and I/O controller 850 can include an IC chip.

Processor 815 can include a general-purpose processor or an application specific integrated circuit (ASIC). Processor 815 can include a central processing unit (CPU).

Memory device 825 can include a dynamic random access memory (DRAM) device, a static random access memory (SRAM) device, a flash memory device, phase change memory, a combination of these memory devices, or other types of memory. FIG. 8 shows an example where memory device 825 is a stand-alone memory device separated from processor 815. In an alternative arrangement, memory device 825 and processor 815 can be located on the same die. In such an alternative arrangement, memory device 825 is an embedded memory in processor 815, such as embedded DRAM (eDRAM), embedded SRAM (eSRAM), embedded flash memory, or another type of embedded memory.

Display 852 can include a liquid crystal display (LCD), a touchscreen (e.g., capacitive or resistive touchscreen), or another type of display. Pointing device 856 can include a mouse, a stylus, or another type of pointing device.

In some arrangements, system 800 does not have to include a display. Thus, display 852 can be omitted from system 800. In some arrangements, system 800 does not have to include an antenna. Thus, antenna 858 can be omitted from system 800.

I/O controller 850 can include a communication module for wired or wireless communication (e.g., communication through one or more antennas 858). Such wireless communication may include communication in accordance with WiFi communication technique, Long Term Evolution Advanced (LTE-A) communication technique, or other communication techniques.

I/O controller 850 can also include a module to allow system 800 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), and other specifications.

Connector 870 can be arranged (e.g., can include terminals, such as pins) to allow system 800 to be coupled to an external device (or system). This may allow system 800 to communicate (e.g., exchange information) with such a device (or system) through connector 870.

Connector 870 and at least a portion of bus 860 can include conductive lines that conform with at least one of USB, DP, HDMI, Thunderbolt, PCIe, and other specifications.

FIG. 8 shows the components of system 800 arranged separately from each other as an example. For example, each of processor 815, memory device 825, memory controller 830, graphics controller 840, and I/O controller 850 can be located on a separate IC (e.g., semiconductor die or IC chip). In some arrangements, two or more components (e.g., processor 815, memory device 825, graphics controller 840, and I/O controller 850) of system 800 can be located on the same die (e.g., same IC chip) that forms a system-on-chip (SoC) or located on the same IC package that forms a system-on-package (SoP) or system-in-package (SiP).

FIG. 8 shows an example number of the components of system 800. However, system 800 may include fewer or more components relative to the components shown in FIG. 8.

Figure 9:
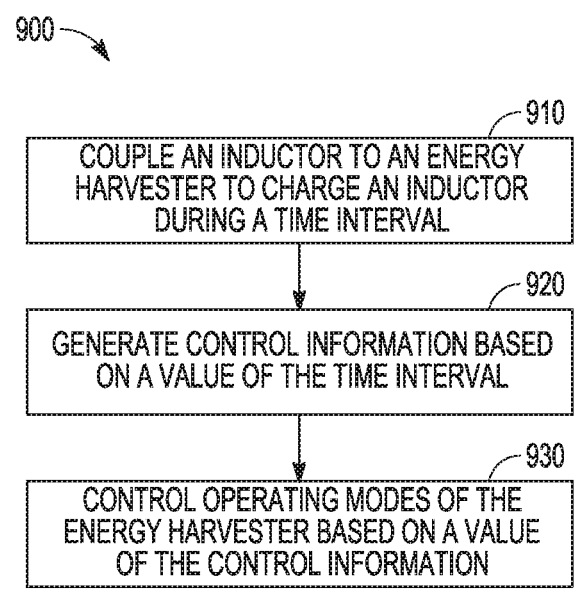
FIG. 9 is a flowchart showing a method of operating an electronic device, according to some embodiments described herein.

FIG. 9 is a flowchart showing a method 900 of operating an electronic apparatus, according to some embodiments described herein. The electronic apparatus used in method 900 can include any of the apparatuses (apparatuses 100 and 200 and system 800, and their components including control units 120 and 220, energy indicator circuits 122, 222, 422, 522, and 722, and generator circuit 629) described above with reference to FIG. 1 through FIG. 8. Some of the activities in method 900 may be performed by hardware, software, firmware, or any combination of hardware, software, and firmware. Such hardware, software, and firmware can be part of the electronic apparatus used in method 900.

As shown in FIG. 9, activity 910 of method 900 can include coupling an inductor to an energy harvester to charge an inductor during a time interval. Activity 920 can include generating control information based on a value of the time interval. Activity 930 can include controlling operating modes of the energy harvester based on a value of the control information.

Method 900 can include fewer or more activities relative to activities 910, 920, and 930 in FIG. 9. For example, method 900 can include activities and operations of apparatuses 100 and 200 and system 800, and their components including control units 120 and 220, energy indicator circuits 122, 222, 422, 522, and 722, and generator circuit 629, described above with reference to FIG. 1 through FIG. 8.

The illustrations of the apparatuses (e.g., apparatuses 100 and 200 and system 800, and their components including control units 120 and 220, energy indicator circuits 122, 222, 422, 522, and 722, and generator circuit 629) and methods (e.g., method 900 and operations of apparatuses 100 and 200 and system 800, and their components including control units 120 and 220, energy indicator circuits 122, 222, 422, 522, and 722, and generator circuit 629) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), wearable electronic things (e.g., smart watches), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including a node to couple to an energy harvester, a switch to couple an inductor to the node for a time interval to allow charging of the inductor during the time interval, and a circuit to generate control information having a value based on a value of the time interval.

In Example 2, the subject matter of Example 1 may optionally include, wherein the energy harvester is arranged to be in a first operating mode if the control information has a first value, and in a second operating mode if the control information has a second value.

In Example 3, the subject matter of Example 2 may optionally include, wherein the energy harvester is arranged to harvest energy in the first mode and to stop harvesting energy in the second mode.

In Example 4, the subject matter of Example 1 may optionally include, wherein the switch is to turn on during the time interval and to turn off during an additional time interval to allow discharging of the inductor during the additional time interval.

In Example 5, the subject matter of any of Examples 1-4 may optionally include, wherein the circuit includes a delay component to provide a time delay based on the value of the time interval, and the value of the control information is based on a value of the time delay.

In Example 6, the subject matter of any of Examples 1-4 may optionally include, wherein the circuit includes a counter to generate a count based on the value of the time interval, and the value of the control information is based on a value of the count.

In Example 7, the subject matter of any of Examples 1-4 may optionally include, further comprising a comparator to compare a voltage at the node with an additional voltage to generate a signal to control the switch based on a value of the voltage at the node and a value of the additional voltage.

Example 8 includes subject matter (such as a device, an electronic apparatus (e.g., circuit, electronic system, or both), or a machine) including a node to receive a first voltage generated from a photovoltaic cell energy harvester, a switch to couple an inductor to the node, a comparator to compare the first voltage with a second voltage to generate a signal to control a switching of the switch based on a duty cycle of the signal, and a generator circuit including a variable resistor network, the generator circuit to generate the second voltage having a value based on a resistance of the variable resistor network.

In Example 9, the subject matter of Example 8 may optionally include, further comprising a circuit to generate control information having a value based on a charging time of the inductor during a first time interval, wherein the switch is arranged to couple the inductor to the node during the first time interval, and decouple the inductor from the node during a second time interval.

In Example 10, the subject matter of Example 8 may optionally include, wherein the switch is part of a converter circuit coupled between the node and an additional node, and the additional node is arranged to couple to a load.

In Example 11, the subject matter of Example 8 may optionally include, wherein the generator circuit includes a resistor between the node and an intermediate node, and the variable resistor network includes resistors arranged in parallel between the intermediate node and a ground connection.

In Example 12, the subject matter of Example 11 may optionally include, wherein a first resistor has a resistance value R1, the variable resistor network has a resistance value R2, and R2 divided by the sum of R1 and R2 is greater than 0.5.

In Example 13, the subject matter of Example 8 may optionally include, wherein the resistors have different resistance values.

In Example 14, the subject matter of Example 8 may optionally include, wherein the resistors include a first resistor between the intermediate node and the ground connection, and a second resistor between the intermediate node and the ground connection, and the generator circuit includes a first additional switch between the intermediate node and the ground connection, and a second additional switch between the intermediate node and the ground connection.

In Example 15, the subject matter of Example 14 may optionally include, further comprising a circuit to generate a first signal based on a first value of a time interval to control the first additional switch, and a second signal based on a second value of the time interval to control the second additional switch.

Example 16 includes subject matter (such as a device, an electronic apparatus (e.g., circuit, electronic system, or both), or a machine) including an energy harvester, a node coupled to the energy harvester, a control unit including a switch to couple an inductor to the node for a time interval to allow charging of the inductor during the time interval, and a circuit to generate control information having a value based on a value of the time interval, and a battery coupled to the control unit.

In Example 17, the subject matter of Example 16 may optionally include, wherein the control unit is arranged to cause the energy harvester to change from one operating mode to another operating mode based on a value of the control information.

In Example 18, the subject matter of Example 16 may optionally include, wherein the control unit includes a comparator to compare a first voltage at the node with a second voltage to generate a signal to control a switching of the switch based on a duty cycle of the signal.

In Example 19, the subject matter of Example 18 may optionally include, wherein further comprising a generator circuit to generate the second voltage having a value based on a resistance of a variable resistor network coupled between the node and a ground connection.

In Example 20, the subject matter of any of Examples 16-19 may optionally include, wherein the energy harvester includes a photovoltaic cell energy harvester.

In Example 21, the subject matter of any of Examples 16-19 may optionally include, wherein the energy harvester includes a thermoelectric generator.

Example 22 includes subject matter (such as a method of operating a device, an electronic apparatus (e.g., circuit, electronic system, or both), or a machine) including coupling an inductor to an energy harvester to charge the inductor during a time interval, generating control information based on a value of the time interval, and controlling operating modes of the energy harvester based on a value of the control information.

In Example 23, the subject matter of Example 22 may optionally include, wherein controlling the operating modes of the energy harvester includes causing the energy harvester to be in a first operating mode among the operating modes to stop the energy harvester from harvesting energy if the control information has a first value.

In Example 24, the subject matter of Example 22 may optionally include, wherein controlling the operating modes of the energy harvester includes causing the energy harvester to be in a second operating mode among the operating modes to allow the energy harvester to harvest energy if the control information has a second value.

In Example 25, the subject matter of Example 22 may optionally include, further comprising generating a reference voltage, and comparing the reference voltage with a voltage at a node coupled to the energy harvester, wherein coupling the inductor to the energy harvester includes using a switch to couple the inductor to the energy harvester, and a duty cycle of a signal controlling the switch is based on values of the reference voltage and the voltage at the node.

In Example 26, the subject matter of Example 22 may optionally include, wherein generating the reference voltage includes varying a value of a variable resistor network arranged between the node and a ground connection.

Example 27, includes subject matter (such as a device, an electronic apparatus (e.g., circuit, electronic system, or both), or machine) including means for performing any of the methods of Examples 22-26.

The subject matter of Example 1 through Example 27 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a node to couple to an energy harvester;
a switch to couple an inductor to the node for a time interval to allow charging of the inductor during the time interval and to decouple the inductor from the node for an additional time interval to allow discharging of the inductor during the additional time interval; and
a circuit to generate control information having a value based on a value of the time interval of the charging of the inductor.

2. The apparatus of claim 1, wherein the switch is to turn on during the time interval and to turn off during the additional time interval.

3. The apparatus of claim 1, wherein the circuit includes a delay component to provide a time delay based on the value of the time interval, and the value of the control information is based on a value of the time delay.

4. The apparatus of claim 1, wherein the circuit includes a counter to generate a count based on the value of the time interval, and the value of the control information is based on a value of the count.

5. The apparatus of claim 1, further comprising a comparator to compare a voltage at the node with an additional voltage to generate a signal to control the switch based on a value of the voltage at the node and a value of the additional voltage.

6. An apparatus comprising:
a node to couple to an energy harvester;
a switch to couple an inductor to the node for a time interval to allow charging of the inductor during the time interval; and
a circuit to generate control information having a value based on a value of the time interval, wherein the energy harvester is arranged to be in a first operating mode if the control information has a first value, and in a second operating mode if the control information has a second value.

7. The apparatus of claim 6, wherein the energy harvester is arranged to harvest energy in the first mode and to stop harvesting energy in the second mode.

8. An apparatus comprising:
a node to receive a first voltage generated from a photovoltaic cell energy harvester;
a switch to couple an inductor to the node;
a comparator to compare the first voltage with a second voltage to generate a signal to control a switching of the switch based on a duty cycle of the signal; and
a generator circuit including a variable resistor network, the generator circuit to generate the second voltage having a value based on a resistance of the variable resistor network, wherein the generator circuit includes a resistor between the node and an intermediate node, and the variable resistor network includes resistors arranged in parallel between the intermediate node and a ground connection.

9. The apparatus of claim 8, further comprising a circuit to generate control information having a value based on a charging time of the inductor during a first time interval, wherein the switch is arranged to couple the inductor to the node during the first time interval, and decouple the inductor from the node during a second time interval.

10. The apparatus of claim 8, wherein the switch is part of a converter circuit coupled between the node and an additional node, and the additional node is arranged to couple to a load.

11. The apparatus of claim 8, wherein a first resistor has a resistance value R1, the variable resistor network has a resistance value R2, and R2 divided by the sum of R1 and R2 is greater than 0.5.

12. The apparatus of claim 8, wherein the resistors have different resistance values.

13. The apparatus of claim 8, wherein the resistors include a first resistor between the intermediate node and the ground connection, and a second resistor between the intermediate node and the ground connection, and the generator circuit includes a first additional switch between the intermediate node and the ground connection, and a second additional switch between the intermediate node and the ground connection.

14. The apparatus of claim 13, further comprising a circuit to generate a first signal based on a first value of a time interval to control the first additional switch, and a second signal based on a second value of the time interval to control the second additional switch.

15. An electronic system comprising:
an energy harvester;
a node coupled to the energy harvester;
a control unit including a switch to couple an inductor to the node for a time interval to allow charging of the inductor during the time interval, and a circuit to generate control information having a value based on a value of the time interval; and
a battery coupled to the control unit wherein the control unit is arranged to cause the energy harvester to change from one operating mode to another operating mode based on a value of the control information.

16. The electronic system of claim 15, wherein the control unit includes a comparator to compare a first voltage at the node with a second voltage to generate a signal to control a switching of the switch based on a duty cycle of the signal.

17. The electronic system of claim 15, wherein the energy harvester includes a photovoltaic cell energy harvester.

18. An electronic system comprising:
an energy harvester;

a node coupled to the energy harvester;

a control unit including a switch to couple an inductor to the node for a time interval to allow charging of the inductor during the time interval, and a circuit to generate control information having a value based on a value of the time interval;

a battery coupled to the control unit, wherein the control unit includes a comparator to compare a first voltage at the node with a second voltage to generate a signal to control a switching of the switch based on a duty cycle of the signal; and a generator circuit to generate the second voltage having a value based on a resistance of a variable resistor network coupled between the node and a ground connection.

19. The electronic system of claim 18, wherein the energy harvester includes a thermoelectric generator.

* * * * *